United States Patent [19]

Patterson et al.

[11] 4,199,737
[45] Apr. 22, 1980

[54] MAGNETOSTATIC WAVE DEVICE

[75] Inventors: Ralph W. Patterson, Cupertino, Calif.; Terence W. O'Keeffe, Churchill Boro; John D. Adam, Murrysville Boro, both of Pa.

[73] Assignee: Westinghouse Electric Corp., Pittsburgh, Pa.

[21] Appl. No.: 952,432

[22] Filed: Oct. 18, 1978

[51] Int. Cl.² .................... H03H 9/26; H03H 9/34; H03H 9/30; H01P 3/08
[52] U.S. Cl. .................... 333/154; 310/25; 333/156; 333/196; 333/246
[58] Field of Search .................... 333/148–155, 333/193–196, 246, 166, 24.1, 24.2; 364/819–824; 310/26, 313; 330/5.5; 332/51 R, 51 H, 51 W, 29 R, 29 M; 331/107 A, 155, 157

[56] References Cited
U.S. PATENT DOCUMENTS

| 3,353,118 | 10/1967 | Olson et al. | 332/29 R |
| 3,553,733 | 1/1971 | Buck | 333/24.1 X |
| 4,028,639 | 6/1977 | Hagon et al. | 331/107 A |

FOREIGN PATENT DOCUMENTS 1364894  8/1974  United Kingdom .................... 333/148

OTHER PUBLICATIONS

Adam et al., "Microwave Magnetostatic Delay Devices Based on Epitaxial Yttrium Iron Garnet", Proceedings of the IEEE, vol. 64, No. 5, May 1976, pp. 794–800.

Primary Examiner—Alfred E. Smith
Assistant Examiner—Marvin Nussbaum
Attorney, Agent, or Firm—D. Schron

[57] ABSTRACT

A magnetostatic wave device for microwave signal processing which includes an input or output transducer finger arrangement which allows shaping of the device response. Two sets of interdigitated fingers are connected to receive the same microwave input signal which is power divided between the two sets. The fingers of one set are substantially parallel to, and in side-by-side relationship with, the fingers of the other set. The device may be used for delay lines, filters, signal correlation, oscillators and numerous other microwave signal processing arrangements.

11 Claims, 22 Drawing Figures

MAGNETOSTATIC WAVE DEVICE

BACKGROUND OF THE INVENTION

1. Field of the Invention

The invention in general relates to microwave signal processing, and particularly to an improved input or output for a magnetostatic wave device.

2. Description of the Prior Art

In the field of microwave signal processing, use is made of a device which provides a predetermined delay or predetermined filtering action to the microwave signals. Such devices find multiple uses in such areas as signal correlation, communications path length equalizer, electronic counter measures, frequency synthesis, Fourier transformation, and oscillators, to name a few.

A popular device of compact construction which performs signal processing is the surface acoustic wave (SAW) device which basically includes a plurality of interdigital transducer fingers positioned on a substrate such as a piezoelectric material. A signal applied to the interdigitated fingers is launched as a surface acoustic wave in the piezoelectric which includes a similar interdigitated electrode array spaced from the launching array to reconvert the acoustic wave back to a microwave signal. SAW devices are extremely useful in the microwave region up to about 2 to 3 gigahertz (GHz). At higher frequencies, SAW device operation results in objectionable losses and the electrode finger width decreases with increasing frequency of operation. The interdigitated fingers are generally applied by means of a photolithographic fabrication which is limited in the fineness of electrode finger which may be provided.

Accordingly, for operation at elevated microwave frequencies, for example, well into the X-band region to at least 15 to 20 GHz, use is made of magnetostatic wave (MSW) devices which are compact solid state devices including electrodes and a substrate and wherein slow spin magneto-static waves are propagated at microwave frequencies in a low loss ferrimagnetic material placed within a biasing magnetic field. The preferred propagation medium is single crystal yttrium iron garnet (YIG) which is generally grown by liquid phase epitaxy on a matching non-magnetic single crystal substrate of gadolinium gallium garnet (GGG). These MSW devices have lower propagation losses than SAW devices and their photolithographic requirements are minimal owing to their relatively longer wavelengths in the propagating medium.

Single finger transducers in MSW devices result in wideband delay units, however, for many types of signal processing, a relatively narrow band filtering action is desirable. The design of transducers to implement specific device functions currently does not compare with the sophisticated designs of SAW transducers.

SUMMARY OF THE INVENTION

The present invention advances the state of MSW devices so that the input or output transducers may be specifically tailored to a particular requirement, as is done in the SAW devices.

The magnetostatic wave device of the present invention is operable within a biasing magnetic field and includes a magnetostatic wave supporting material together with first and second spaced apart microstrip coupling sections in operative relationship with the material. The first and second sections each include a plurality of spaced generally parallel electrically conductive members, or fingers, with the fingers of the two sections being in interdigital relationship. Means are provided for electrically connecting both of said sections together and supplying them in parallel from a common source of microwave signal in a manner that the respective currents in the fingers of the first and second coupling sections are in phase opposition. The same type of structure may also be utilized as a receiver of launched magnetostatic waves. In a simpler form, the first and second microstrip coupling sections would be comprised of single finger portions in substantially parallel side-by-side relationship.

DESCRIPTION OF THE PREFERRED EMBODIMENTS

Figure 1:
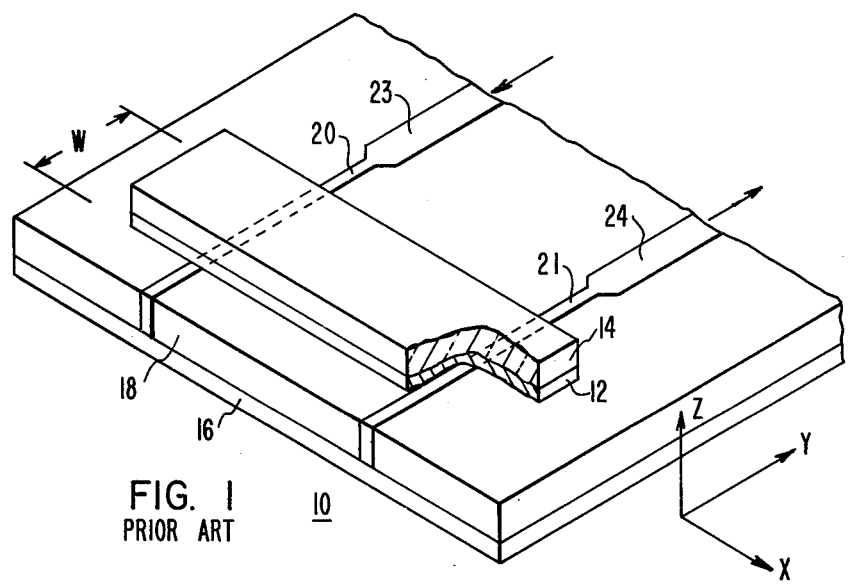
FIGS. 1 and 2 illustrate typical prior art magnetostatic wave devices.

Referring now to FIG. 1, there is illustrated a typical magnetostatic wave device 10 which includes an epitaxial YIG film 12 of width W on a GGG substrate 14. The structure is separated from a ground plane 16 by a dielectric layer 18 such as alumina.

Magnetostatic waves which propagate in the YIG films are commonly launched and detected by narrow microstrip transducers, and FIG. 1 illustrates an input transducer 20 and an output transducer 21 electrically connected to the ground plane 16. These microstrips 20 and 21 include respective enlarged sections 23 and 24 forming an impedance matching section to match external circuitry. For magnetostatic wave propagation, a DC magnetic bias field is applied to the YIG sample and, with relation to the XYZ coordinate system illustrated, if the bias field is in the Z direction, foward volume waves are propagated, if it is in the X direction, backward volume waves are propagated, and if it is in the Y direction, surface waves are propagated.

The structure illustrated in FIG. 1 operate efficiently at relatively low frequencies where the width W is much less than a quarter wavelength of the electromagnetic wave in the microstrip, the wavelength being a function of the dielectric 18. At X-band frequencies, the electromagnetic wavelength in the microstrip is of the same order as the width W and efficient transduction is possible with an open circuited microstrip as illustrated in FIG. 2 wherein components identical to those illustrated in FIG. 1 have been given like reference numerals.

Figure 2:
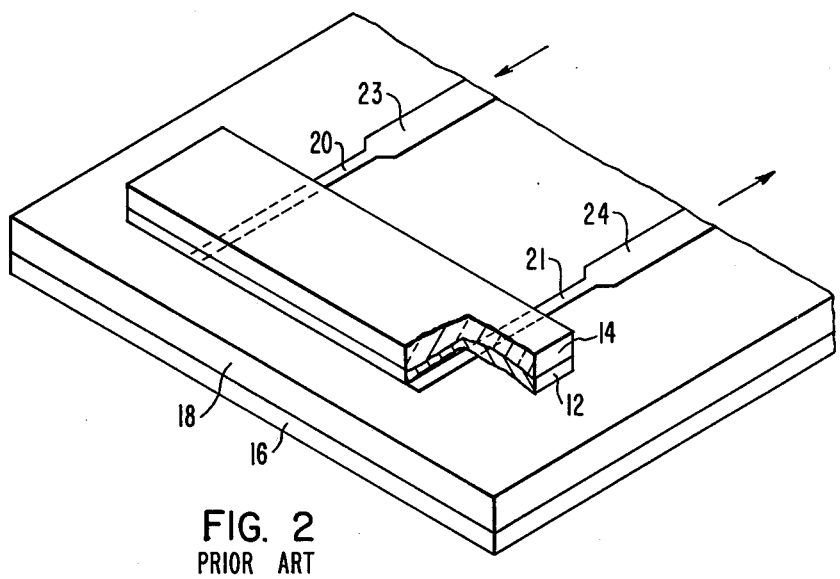
Figure 3:
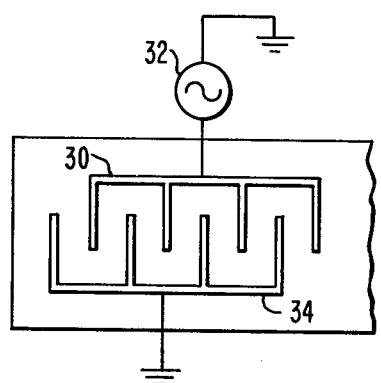
FIG. 3 illustrates an interdigital transducer array for a surface acoustic wave device of the prior art.

The devices illustrated in FIGS. 1 and 2 do not lend themselves to selective filtering action. For example, in a SAW device, such as illustrated in FIG. 3, a plurality of interdigitated fingers is utilized for shaping the response of the device. A first plurality of fingers 30 connected to a source of input signal 32 is interdigitated with a second plurality of fingers 34 connected to ground potential. The fingers are fabricated on a substrate which supports surface acoustic waves, one example being a piezoelectric material.

Figure 4:
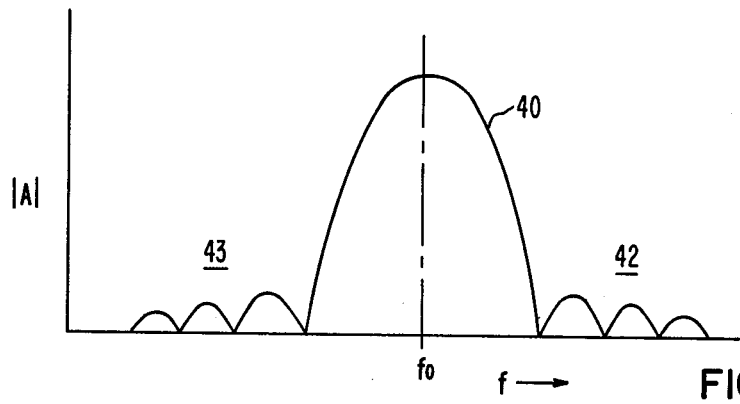
FIG. 4 is a curve demonstrating a sin X/X response.
Figure 5:
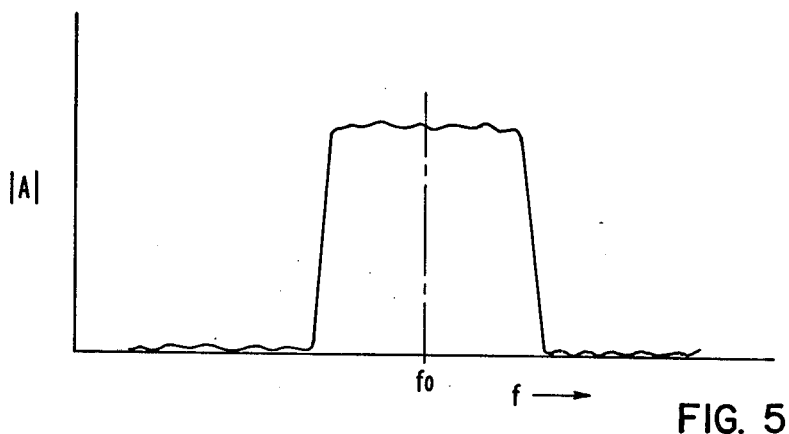
FIG. 5 illustrates a desired response for some particular applications.

This type of SAW device will provide a response such as illustrated in FIG. 4 wherein frequency is plotted on the horizontal axis and amplitude on the vertical axis. The curve has a large peak 40 and lower side lobe levels 42 and 43 and approximates a sin X/X curve. By varying the length and spacing of the interdigitated fingers, the response may be shaped as in FIG. 5 to lower the sidelobes and to flatten the peak so that the device may operate as an efficient filter.

The device of FIG. 3, however, cannot operate efficiently at the higher X-band frequencies due to the severe and unacceptable losses encountered. In addition, the center-to-center separation between adjacent fingers is approximately one-half wavelength of the surface acoustic wave, the wavelength being determined by the properties of the substrate. At the elevated X-band frequencies, the fingers would have to be so close together as to make fabrication by conventional techniques extremely difficult, if not impossible.

Figure 6:
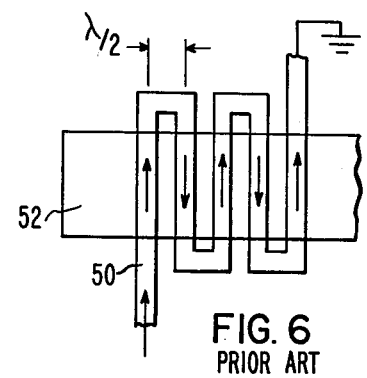
FIGS. 6 and 7 illustrate prior art input or output transducers for a magnetostatic wave device.
Figure 7:
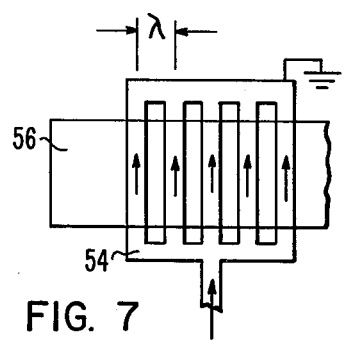

Attempts to duplicate the SAW type of device using multiple fingers in MSW devices have included the use of meander lines and parallel bar arrangements such as illustrated in FIGS. 6 and 7. In FIG. 6, an input microstrip coupler 50 is of a serpentine shape called a meander line, wherein alternate legs are spaced one-half the magnetostatic wavelength apart, in operative relationship with a YIG film 52. The magnetic field under each leg of the meander line changes direction, thus giving rise to the type of magnetic field distribution required for launching a magnetostatic wave having an approximate sin X/X response. With operation at higher frequencies, however, the total electrical length of the meander line becomes much greater than half the electromagnetic wavelength which leads to changes in phase along the meander line necessitating a rearrangement of the spacing of the legs. This alteration to compensate for change in phase is extremely complicated. In addition, since the sections are connected in series, the section closest to the input will transduce more strongly than the section nearer the end of the line so that there will be a weighting of the transducer toward the input end which additionally must be compensated for in the design.

The parallel bar arrangement 54 illustrated in FIG. 7 is disposed relative to a YIG film 56 with the structure being fabricated such that the spacing between adjacent legs is approximately one magnetostatic wavelength. The type of structure illustrated in FIG. 7 produces undesirable harmonic responses (peaks) at various frequencies. Further, with the parallel bar arrangement, there are not too many degrees of freedom in weighting, such as done in SAW technology. For example, changing the relative lengths of the parallel bars would be impossible.

In the present invention, a magnetostatic wave device is provided wherein the input or output transducer may have interdigitated fingers so as to be able to tailor the response for particular applications. One embodiment of the invention is illustrated in FIG. 8 which includes an input transducer 60 mounted on a substrate 62 and being in operative relationship with a YIG film 64 (the GGG is not shown).

The input transducer 60 includes first and second coupling sections 66 and 68 each having a respective plurality of finger members or portions 70 and 72 with the finger portions of one being in interdigital relationship with the finger portions of the other coupling section. By way of example, five finger members are included in each plurality.

Figure 9:
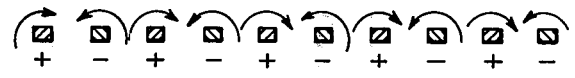
FIG. 9 is a view along A—A of FIG. 8 illustrating the magnetic fields involved in the generation of a magnetostatic wave.

The input transducer 60 includes an input section 74 which is connected to a source of microwave input signal 76. The input section 74 in conjunction with arms 78 and 80 power divide the input signal so that the two sets of fingers are fed equally and in phase from opposite ends resulting in the required substantially 180° microwave magnetic field reversal under adjacent fingers. For example, FIG. 9 illustrates a view along line IX—IX of FIG. 8 to illustrate the current flow in adjacent fingers with the + indicating flow away from the viewer and -indicating flow toward the viewer. The arrows represent the direction of resultant magnetic field produced by each of the respective fingers.

Figure 8:
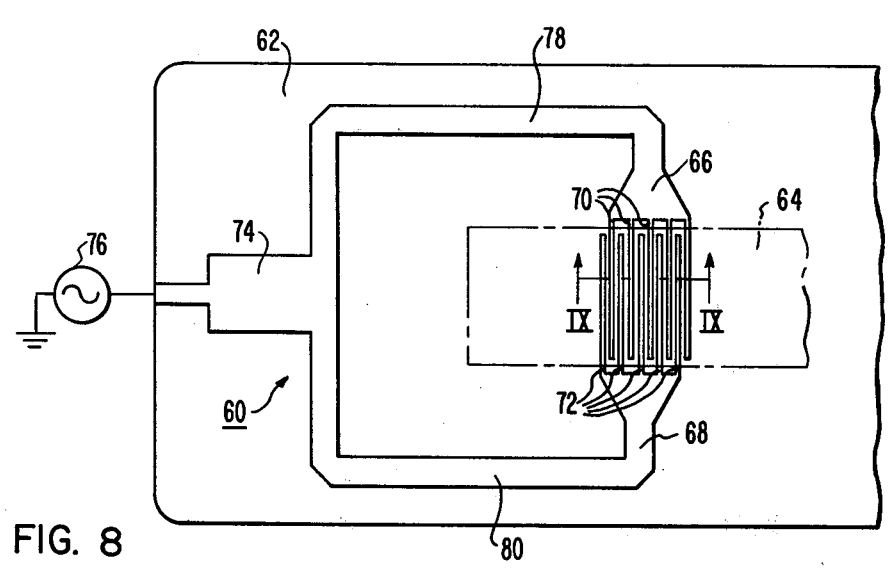
FIG. 8 illustrates one embodiment of the present invention.
Figure 10:
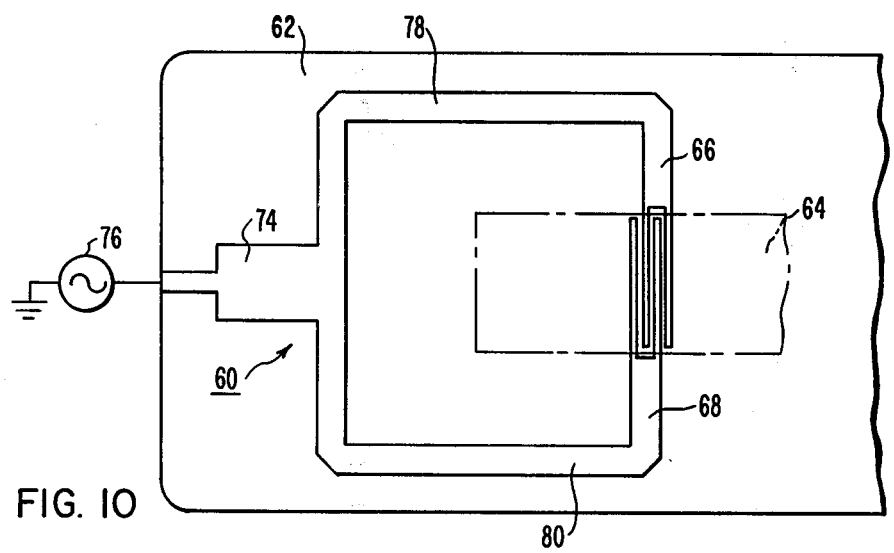
FIGS. 10 and 11 illustrate a further embodiment of the present invention.
Figure 11:
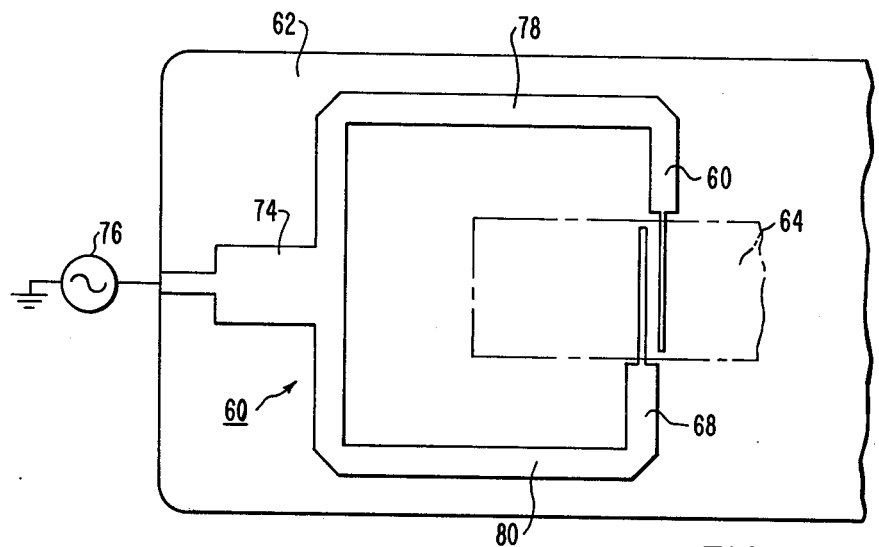

FIG. 10 illustrates an arrangement similar to FIG. 8, however, with only two fingers per coupling section, in interdigital relationship, and FIG. 11 shows an arrangement utilizing a single finger portion for each section with each finger portion being in substantial parallel side-by-side relationship with the finger portion of the other section. In each embodiment, the microstrip coupling sections are electrically connected together and supplied in parallel from the common source of microwave signal, as opposed to a SAW type device wherein only one of the sets of interdigitated fingers are connected to the source of input signal, the other set being connected to ground potential.

The structures of FIGS. 8, 10 and 11 may also be utilized as output structures responsive to a launched magnetostatic wave to provide a corresponding microwave output signal at section 74 which would then constitute an output section.

Figure 12:
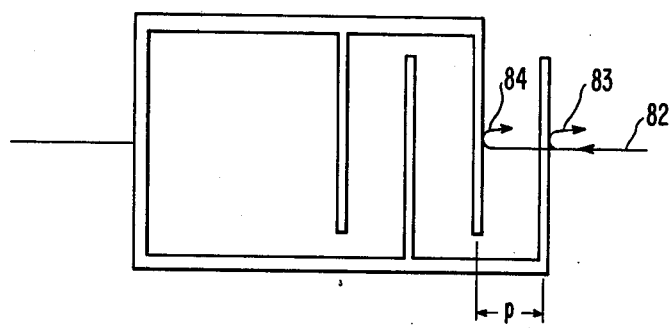
FIG. 12 illustrates an input or output transducer and defines the distance between adjacent fingers.
Figure 13:
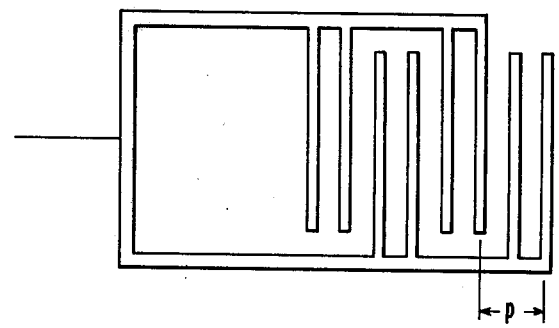
FIG. 13 is an embodiment of an input or output transducer utilizing split fingers to reduce reflections.

FIG. 12 schematically illustrates a four finger transducer with the spacing between adjacent finger being designated p. If p is nominally $\lambda/2$, where $\lambda$ is the magnetostatic wavelength then a magnetostatic wave travelling toward the transducer, as indicated by arrow 82 will not only be sensed by the transducer arrangement but will additionally be partially reflected, as indicated by arrows 83 and 84 from the finger members. Maximum reflection occurs with the $p=\lambda/2$ spacing. In order to reduce the reflection somewhat, each finger member may be split, as illustrated in FIG. 13 with the spacing between split finger pairs being the same $\lambda/2$, however, maximum reflections do not take place since the distance between any two adjacent members is less than λ/2. Each split finger performs the same function as an individual finger of FIG. 12.

Figure 14:
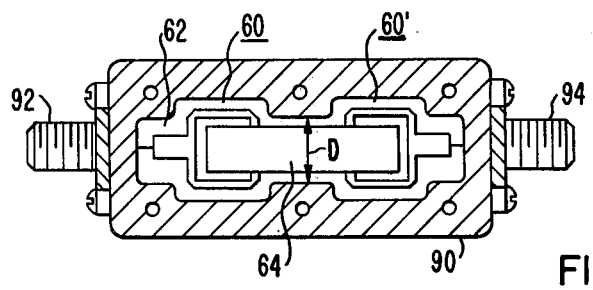
FIG. 14 is a view of a magnetostatic wave unit illustrating input and output connections thereto.

FIG. 14 illustrates a microwave structure incorporating a magnetostatic wave arrangement such as illustrated in FIG. 10. The magnetostatic wave device includes both a transmitting transducer 60 and a similar receiving transducer, designated 60', spaced therefrom within a housing 90, the cover of which has been omitted to show the interior thereof.

YIG film 64 extends between the input and receiver transducers and microwave energy is coupled to the input transducer by means of a connector 92, and energy is extracted from the receiver transducer by means of connector 94.

In order to reduce microwave coupling in free space between the input and output transducers, housing 90 includes a portion of reduced dimension D of a value chosen such that the reduced portion is operable as a cut-off waveguide at the operating frequency. That is, the electromagnetic field introduced into the waveguide section will not produce a wave and consequently, the receiver transducer 60' will not pick up any leakage signal.

Figure 15:
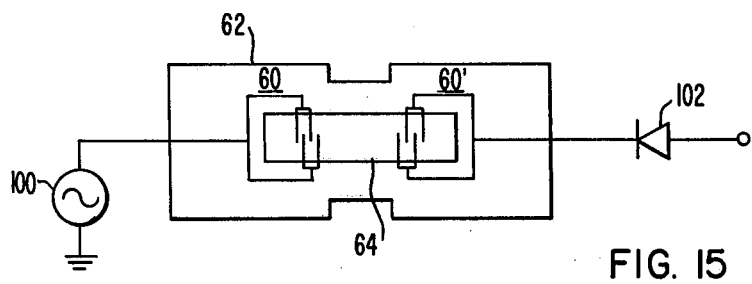
FIG. 15 schematically illustrates the unit of FIG. 14 in a test set-up.
Figure 16:
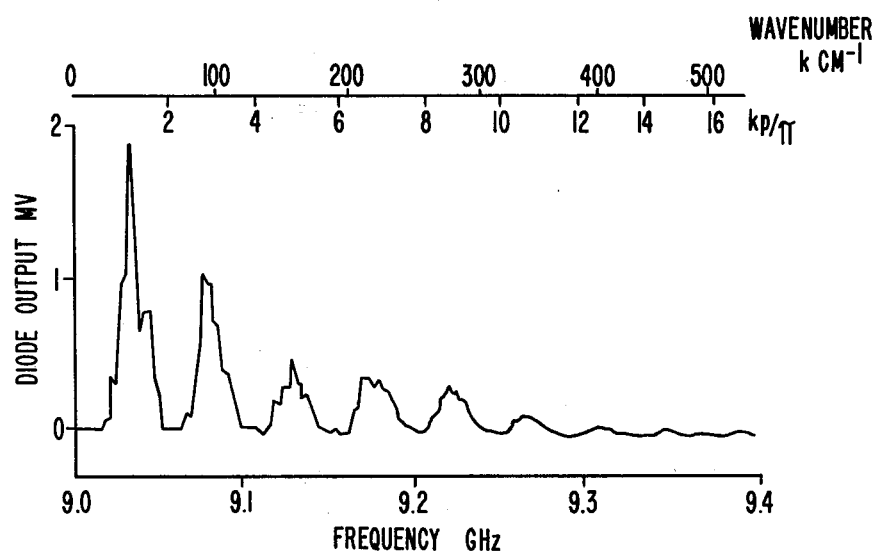
FIGS. 16 and 17 illustrate the response of the test set-up of FIG. 15 with two different transducer arrangements.

The arrangement of FIG. 15 was utilized to demonstrate the operation of the magnetostatic wave device described herein. The test set-up is schematically illustrated in FIG. 15 and includes a source of microwave input signal 100 which periodically increases in frequency as a function of time between the values of 9.0 and 9.4 GHz. The signal is provided to the input transducer 60 and the output transducer 60' is connected to an output diode detector 102 from which an output signal is derived. The device was placed in a magnetic bias field of $4.712 \times 10^3$ Oe perpendicular to the YIG film 64 so as to propagate magnetostatic volume waves. The YIG film itself had a thickness of 6.9 microns and was 3 mm. wide. The alumina substrate 62 was 0.635 mm. thick and the separation between input and output transducers was 1 cm. FIG. 16 illustrates the output of the diode detector for a transducer as illustrated in FIG. 11, with a 1 mm. finger separation.

The diode output in millivolts is plotted on the vertical scale and the frequency in GHz is plotted on the lower horizontal scale. Also illustrated, on the upper horizontal scale is the variation in wave number k, in $CM^{-1}$ as well as $kp/\pi$.

The wave number k by definition is $k = 2\pi/\lambda$, where λ is the wavelength of the magnetostatic wave. If the distance between fingers of the same section (see FIG. 12) is 2p (or p between adjacent fingers of different sections) and if $k_0$ is the wave number of the magnetostatic wave for which this finger spacing corresponds to the magnetostatic wave wavelength, then $\lambda = 2p$ (or $(\lambda/2) = p$)

$k_0 = 2\pi/\lambda = 2\pi/2p$ $k_0 = \pi/p$

This $k_0$ represents the first (i.e. lowest k) resonant condition, and subsequent peaks will occur at $N\pi/p$ where N is an odd integer. Conversely, nulls will occur at $N\pi/p$ where N is an even integer.

Under the conditions given, a peak output signal does not occur until $Kp/\pi = 1$. The curve of FIG. 16 shows this peak at $k_0$ equal to approximately $\pi/p$ and subsequent peaks occurring at $3k_0$, $5K_0$, $7k_0$, $9k_0$, etc. The subsequent peaks are reduced in amplitude due to propagation losses and due to the reduction in radiation resistance of the individual transducer fingers. The apparent ripples of the diode output are believed due to some electromagnetic feedthrough.

Figure 17:
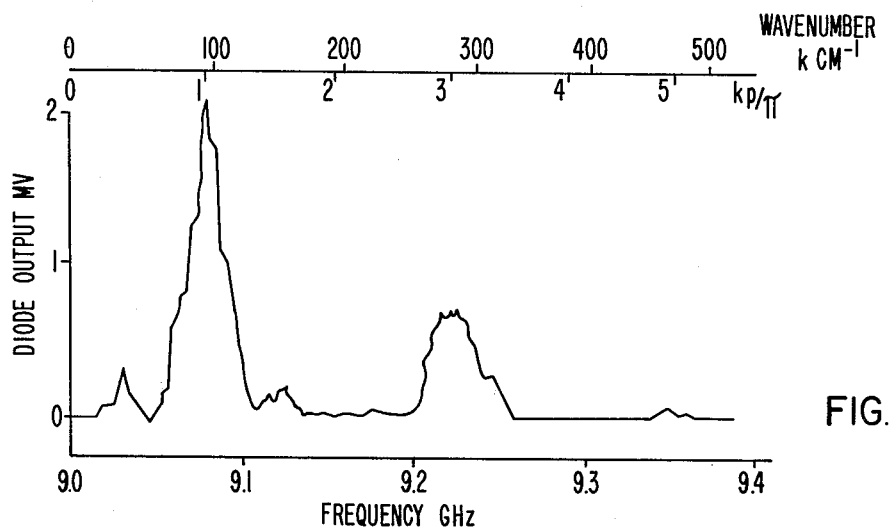
Figure 19:
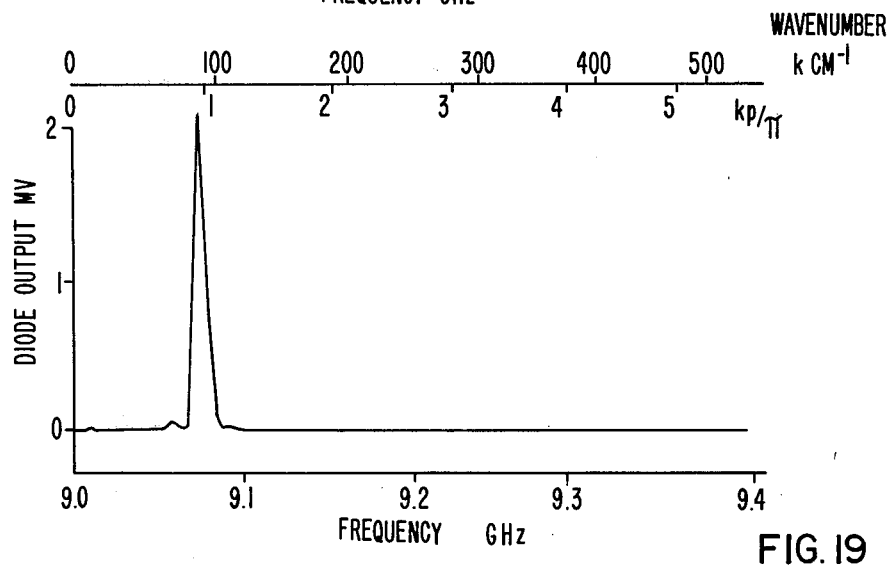
FIG. 19 illustrates the response of the set-up of FIG. 14 with the spacing illustrated at FIG. 18.
Figure 18:
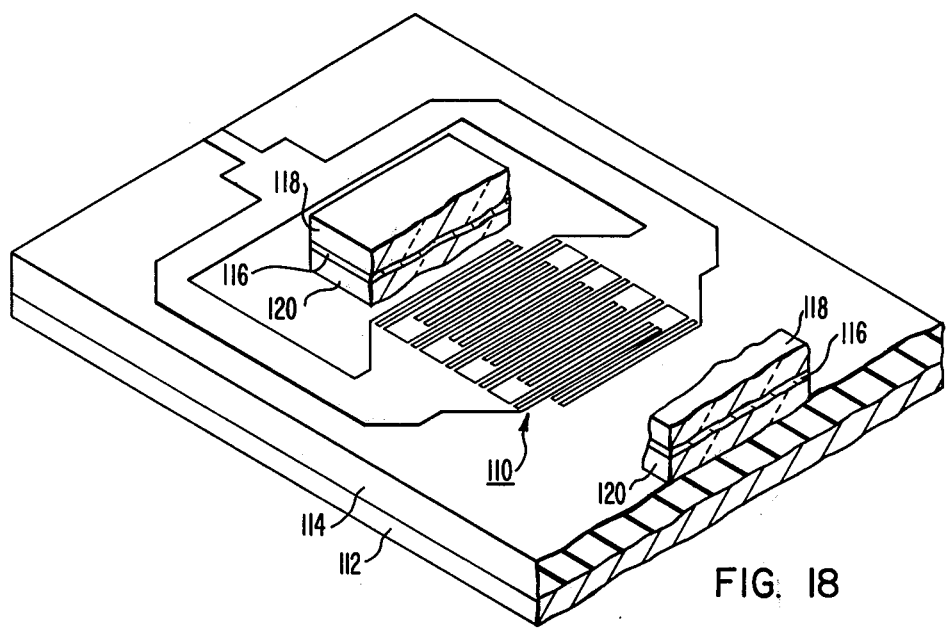
FIG. 18 illustrates an alternate spacing of the input or output transducer relative to a YIG film.

The results of a subsequent test with the arrangement of FIG. 10 is illustrated by the curve of FIG. 17, obtained with a finger separation of 0.33 mm. It is seen that peaks occur at $k_0$, $3k_0$, and $5k_0$. With the microstrip coupling directly contacting the YIG film, under many conditions, the coupling is too strong and interference reflections degrade the performance to give lower peak to sidelobe ratios than desired. In order to improve performance therefor, the microstrip coupling may be spaced from the YIG film as illustrated in FIG. 18 which shows a ten finger transducer 110 spaced from a ground plane 112 by an intermediate alumina layer 114. As before, a YIG film 116 is on a GGG substrate with the YIG film being spaced from the transducer by an intermediate dielectric layer 120. The curve of FIG. 19 resulted from the testing of a ten split finger arrangement with a dielectric spacer of mylar having a thickness of 100 microns with a 0.165 mm. spacing between transducer fingers. Curve 19 shows a sharp peak at $k_0$ with sidelobs being reduced in amplitude due to the effect of the dielectric spacer. Additionally, subsequent peaks at $3k_0$, $5k_0$, etc. are also greatly reduced in amplitude due to the spacer.

Figure 20:
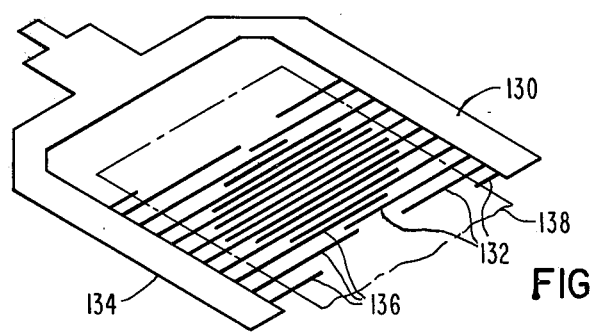
FIGS. 20 through 22 illustrate various transducer finger arrangements.

The transducer arrangements described herein thus far demonstrate an approximate sin X/X frequency response. As opposed to the meander line and bar array of the prior art, the present invention allows selective shaping of the response in an MSW device by means of varying the finger parameters. For example, FIG. 20 illustrates a first microstrip coupling section 130 having a plurality of finger members 132, together with a second microstrip coupling section 134 having a plurality of finger members 136. The finger members are disposed relative to a YIG film 138. In the arrangement of FIG. 20, the lengths of the finger members 132 are varied as are the lengths of finger members 136. As a result, only some of the finger members of the two coupling sections are in interdigital relationship. The spacing between finger members is uniform and this type of finger length weighting will allow a tailoring of the response by lowering the side loe levels and squaring off the main peak.

Figure 21:
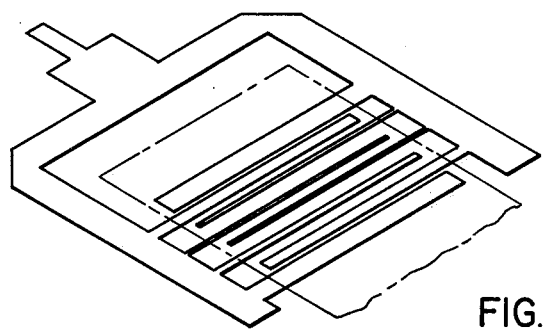

FIG. 21 illustrates a finger width weighting arrangement for accomplishing a similar purpose wherein the spacing between adjacent fingers (from center to center) is uniform but wherein the fingers are of variable width from finger to finger.

Figure 22:
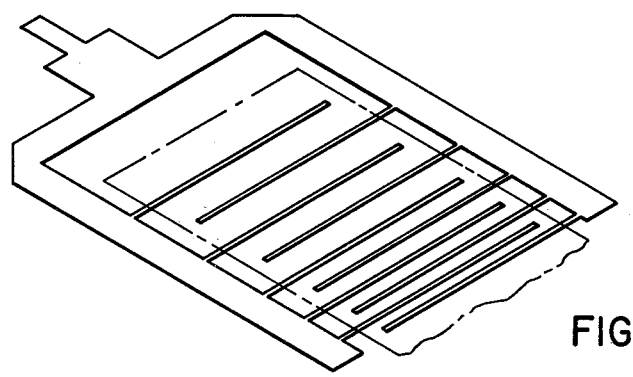

The transducer arrangement of the present invention not only allows the variation of finger parameters to reduce side lobe levels and square off peak responses, but also allows control of the time delay as a function of frequency. This may be accomplished with the arrangement of FIG. 22 wherein the spacing between adjacent fingers is non-uniform. In two cases of practical interest the finger spacing would be calculated to compensate for inherent time delay variation with frequency characteristics of the MSW. Thus with the arrangement, either a constant delay device or a linearly changing (increasing or decreasing) delay device, operable over a relatively wide bandwidth, may be provided.

We claim:

1. A magnetostatic wave device operable within a biasing magnetic field, comprising:
   (a) a magnetostatic wave supporting material;
   (b) first and second spaced apart microstrip coupling sections in operative relationship with said material;
   (c) each said section having at least one finger member in substantially parallel side-by-side relationship with the finger member of the other said section;
   (d) means for electrically connecting both said sections together so as to be electrically in parallel in a manner that if said device is operated as a launcher of magnetostatic waves by coupling to an input microwave signal the current in said side-by-side fingers will be in opposite directions and if said device is operated as a magnetostatic wave receiving currents will be induced in said side-by-side fingers, which currents are in opposite directions.

2. Apparatus according to claim 1 wherein:
   (a) each said coupling section includes a plurality of said fingers.

3. Apparatus according to claim 2 wherein:
   (a) all of said fingers are of the same length.

4. Apparatus according to claim 2 wherein:
   (a) said fingers are of various lengths.

5. Apparatus according to claim 2 wherein:
   (a) said fingers are of various widths.

6. Apparatus according to claim 2 wherein:
   (a) the distance between adjacent fingers is uniform.

7. Apparatus according to claim 2 wherein:
   (a) the distance between adjacent fingers is non-uniform.

8. Apparatus according to claim 1 wherein:
   (a) said coupling sections contact said magnetostatic wave supporting material.

9. Apparatus according to claim 1 wherein:
   (a) said coupling sections are displaced from said magnetostatic wave supporting material.

10. Apparatus according to claim 9 which includes:
    (a) a dielectric spacing member interposed between said coupling sections of said magnetostatic wave supporting material; and
    (b) said coupling sections contacting said dielectric spacing member.

11. Apparatus according to claim 1 wherein said device is a launcher of magnetostatic waves and wherein:
    (a) said means for electrically connecting both said coupling sections together includes a microstrip power divider section; and
    (b) said power divider section being coupled to a source of microwave signal and operable to equally divide an input microwave signal between said coupling sections.

* * * * *